(12) United States Patent
Frei et al.

(10) Patent No.: US 9,773,951 B2
(45) Date of Patent: Sep. 26, 2017

(54) OPTOELECTRONIC MODULE AND A PROCESS FOR THE PRODUCTION OF AN OPTOELECTRONIC MODULE

(71) Applicant: OSRAM Opto Semiconductors GmbH, Regensburg (DE)

(72) Inventors: Ulrich Frei, Obertraubling (DE); Rainer Huber, Bad Abbach (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 63 days.

(21) Appl. No.: 14/383,091

(22) PCT Filed: Mar. 4, 2013

(86) PCT No.: PCT/EP2013/054286
§ 371 (c)(1),
(2) Date: Sep. 4, 2014

(87) PCT Pub. No.: WO2013/131854
PCT Pub. Date: Sep. 12, 2013

(65) Prior Publication Data
US 2015/0028367 A1 Jan. 29, 2015

(30) Foreign Application Priority Data
Mar. 5, 2012 (DE) .................. 10 2012 101 818

(51) Int. Cl.
*H01L 33/48* (2010.01)
*H01L 33/62* (2010.01)
*H01L 27/15* (2006.01)

(52) U.S. Cl.
CPC .......... *H01L 33/486* (2013.01); *H01L 27/15* (2013.01); *H01L 33/62* (2013.01); *H01L 2924/0002* (2013.01)

(58) Field of Classification Search
CPC ....... H01L 33/486; H01L 27/15; H01L 33/62; H01L 2924/0002
USPC ............................................. 438/15; 257/88
See application file for complete search history.

(56) References Cited

U.S. PATENT DOCUMENTS

2008/0212250 A1* 9/2008 Huang ................. H01T 4/08
361/111
2009/0116209 A1* 5/2009 Engl ................... H01L 33/483
361/818

FOREIGN PATENT DOCUMENTS

| CN | 100416828 C | 9/2008 |
|---|---|---|
| CN | 101470276 A | 7/2009 |
| CN | 101749567 A | 6/2010 |
| DE | 10322757 A1 | 12/2004 |

(Continued)

OTHER PUBLICATIONS

"E-Reihe", <http://de.wikipedia.org/wiki/E-Reihe>, Nov. 2011 (downloaded from EHF Jul. 22, 2014).

(Continued)

*Primary Examiner* — Bo Fan
(74) *Attorney, Agent, or Firm* — McDermott Will & Emery LLP (57) ABSTRACT

An optoelectronic module (100) is defined, comprising at least one semiconductor chip (10) provided for emitting electromagnetic radiation and at least one holding device (20) which is adapted to fix in place a device (50) for encoding at least one optical or electronic parameter of the optoelectronic module (100). Furthermore, a process for the production of the optoelectronic module (100) is defined.

16 Claims, 8 Drawing Sheets

(56) References Cited

FOREIGN PATENT DOCUMENTS

| | | |
|---|---|---|
| DE | 102008025865 A1 | 12/2009 |
| DE | 102008028654 A1 | 12/2009 |
| DE | 102010009718 A1 | 9/2011 |
| DE | 102010033092 A1 | 2/2012 |
| DE | 102011103907 A1 | 8/2012 |
| JP | H7165287 A2 | 6/1995 |
| JP | 2000260581 A | 9/2000 |
| JP | 2013532894 A | 8/2013 |
| WO | WO-2005024898 A2 | 3/2005 |
| WO | 2006/030191 A1 | 3/2006 |
| WO | 2006/063552 A1 | 6/2006 |
| WO | 2007/009447 A2 | 1/2007 |
| WO | 2010/060420 A1 | 6/2010 |

OTHER PUBLICATIONS

"Widerstand (Bauelement)", <http://de.wikipedia.org/wiki/Widerstand_(Bauelement)#Bauformen_und_gr.C3.B6.C3.9Fen_von_SMD_Widerst.C3.A4nden>, Nov. 2011 (downloaded from EHF Jul. 22, 2014).

* cited by examiner

OPTOELECTRONIC MODULE AND A PROCESS FOR THE PRODUCTION OF AN OPTOELECTRONIC MODULE

An optoelectronic module and an illumination device comprising an optoelectronic module according to the invention are defined. Furthermore, a process for the production of an optoelectronic module is defined.

This patent application claims the priority of German Patent Application 10 2012 101 818.9, the disclosure content of which is herewith incorporated by reference.

In radiation-emitting optoelectronic semiconductor devices of one type and manufacturer the production process can give rise to differences in respect of the brightness or the colour location of the emitted light which make it necessary to carry out categorisation ("binning") of the semiconductor devices. In many applications it is necessary that a control unit used for driving the optoelectronic semiconductor device is able to acquire information relating to the categorisation.

An example that may be mentioned is a light-emitting diode module installed in a motor vehicle headlamp. After an accident it may be necessary to replace a headlamp insofar as a control unit associated with the headlamp is still operational. Since it is important that the replacement headlamp does not differ too substantially in terms of brightness from that originally used, the light control unit must be rendered capable of acquiring information relating to the brightness of the newly installed light-emitting diode module.

A number of solutions to this problem are known from the prior art. One solution comprises soldering onto the circuit board carrying the light-emitting diode chip one or more resistors (what are known as binning resistors) the value of which represents the brightness of the light-emitting diode module. If an existing light-emitting diode module is then replaced by a new one, the light control unit is able to determine the resistance and operate the light-emitting diode module, for example by means of pulse width modulation, in such a way that the brightness of the light generated corresponds to the brightness of the light-emitting diode module originally used. A disadvantage of this solution is that certain parts of the light-emitting diode module can become damaged by an additional soldering process.

Another solution comprises retroactively modifying the size of a resistor already provided on the circuit board, for example by laser trimming. A disadvantage of this solution is that additional apparatus needs to be available in order that the resistance value can be exactly adjusted. Should the resistors already present be destroyed by an electrical pulse, however, it is necessary to provide corresponding additional contacts. Overall this represents a substantial outlay in terms of apparatus.

One problem of the invention is that of defining an optoelectronic module to which information relating to the optical parameters thereof can be applied economically and by simple technical means.

That problem is solved by an optoelectronic module in accordance with patent claim 1.

A further problem to be solved is that of producing an optoelectronic module.

That problem is solved by a process in accordance with patent claim 13.

Advantageous configurations and developments of the optoelectronic module and of the process are defined in the respective dependent claims.

In accordance with a preferred embodiment, the optoelectronic module comprises at least one semiconductor device provided for emitting electromagnetic radiation and at least one holding device which is adapted to fix in place a device (component) for encoding at least one optical or electronic parameter of the optoelectronic module.

The semiconductor device is, for example, a laser diode, a laser diode chip, a light-emitting diode or a light-emitting diode chip.

The holding device is preferably adapted to effect irreversible fixing of the device. That is to say, the device is adapted to be inserted into the holding device by the application of little or no force, but can be removed therefrom only by the application of a substantial amount of force or by destruction of the holding device.

Furthermore, it is preferred that the holding device be adapted to fix in place a device (component) that is in the form of a parallelepiped having a first side length of between 0.4 and 7.3 mm, especially between 1.5 and 2.5 mm, a second side length of between 0.2 and 6.1 mm, especially between 0.5 and 1.5 mm, and a third side length of between 0.1 and 4 mm, especially between 0.5 and 1.5 mm, that is to say in a range between lengths that respectively correspond to the smallest and largest possible forms of an SMD device (SMD="surface-mountable device").

It is also preferred that the holding device be in the form of a protective device that at least partly encompasses a device fixed in the holding device.

The holding device makes it possible for a device for encoding the properties of the optoelectronic module to be inserted therein without the need for an additional soldering operation or any other kind of manipulation of the optoelectronic module requiring the use of additional apparatus. In accordance with at least one embodiment, the optoelectronic module further comprises a carrier element. The holding device is arranged on or in the carrier element or on or in a plug-in element or plug-in connector attached to the carrier element.

In particular, the holding device is formed at least in part by a recess in the carrier element, plug-in element or plug-in connector.

The optoelectronic module can further comprise at least two electrical conductor tracks which are adapted to be brought into conductive connection with terminals of a control unit and which are in conductive connection with at least two electrical contact elements arranged in the holding device. By means of the two electrical conductor tracks it is possible to make an electrical connection to a control unit via which information relating to an optical or electronic parameter of the optoelectronic module can be acquired by the control unit. In accordance with a preferred embodiment of the optoelectronic module, the holding device comprises at least one locking device which is movable between a locking position and a receiving position. In the receiving position, a device (component) can be displaced along an insertion direction towards a fixing position inside the holding device. In the locking position, however, the locking device is adapted to effect at least partial fixing of the device in the fixing position. That is to say, in the locking position the locking device can be adapted to fix the device in the fixing position at least in respect of one direction, while other parts of the holding device effect fixing in respect of other directions. It is, however, equally possible for the locking device to effect total fixing of the device in the fixing position.

In a preferred development, the locking device comprises at least one locking element made of elastic material. The locking element is adapted to allow displacement of a device along the insertion direction towards the fixing position. This takes place as a result of the locking element's being elastically deformed in consequence of the displacement. Furthermore, the locking element is arranged so that, once the fixing position of the device has been reached, it assumes its original shape or a shape relatively similar to its original shape and in that way fixes the device in place.

As a result of such an arrangement, a self-closing mechanism is provided. As a consequence of the displacement of the device, which takes place along the insertion direction and ends in the fixing position, the locking element made of elastic material yields and changes from its original shape, which corresponds to the locking position of the locking device, to a shape that corresponds to the receiving position of the locking device. Once the fixing position of the device has been reached, the locking element, under the action of an elastic restoring force, returns to the locking position in which it assumes its original shape or a shape relatively similar to its original shape.

The locking element can preferably be in the form of a tongue which, in the locking position, forms an acute angle of less than 30° with the insertion direction and projects from a lateral inner wall of the holding device.

In accordance with a further preferred embodiment, the optoelectronic module further comprises at least one encoding element which carries information relating to an optical or electronic parameter of the optoelectronic module and is fixed in place by the holding device.

The optical or electronic parameter of the optoelectronic module is, for example, a brightness or a colour location of the electromagnetic radiation emitted by the semiconductor device. Such parameters are preferably nominal or initial parameters the values of which are typically determined prior to the actual start-up of the optoelectronic module at its intended location using a measuring apparatus located externally of the optoelectronic module. For that purpose, prior to the actual start-up of the optoelectronic module the semiconductor device arranged thereon is operated at a reference current and at a reference temperature. The values for the brightness and the colour location determined by the measuring apparatus then form the basis for the information carried in analog or digital form by the encoding element.

Information relating to the colour location are of interest when the radiation emitted by the optoelectronic module is not limited to a single wavelength. Rather, by means of a conversion element arranged downstream of the at least one semiconductor device in the direction of emission, the wavelength of the radiation generated thereby can undergo at least partial conversion. Typically the conversion element absorbs at least a portion of the radiation emitted by the semiconductor device and then emits preferably radiation of a greater wavelength than the wavelength of the radiation originally emitted by the semiconductor device. As a result, mixed-colour light, preferably white light, can be generated.

It is further possible to generate mixed-colour light by using at least two semiconductor devices that emit light of different wavelengths and by mixing the light thereof as desired.

The colour location of the mixed-colour light so generated can be determined with reference to any desired colour space, it being possible to use, for example, a standard colour space system such as a CIE colour space system or a DIN colour space system.

In a preferred development of the invention, the holding device further comprises a cover element.

The information relating to the optical or electronic parameter of the optoelectronic module can be stored in the encoding element in various ways. Preferably, a control unit for driving the optoelectronic module is able to acquire the information provided by the encoding element via transmission means.

For that purpose the encoding element can comprise a resistor the resistance value of which corresponds to the optical or electronic parameter of the optoelectronic module or is dependent thereon. In that case a control unit used for driving the optoelectronic module is adapted to determine the resistance of the encoding element, for example by measuring a voltage drop across the resistor.

Furthermore, the encoding element can comprise a capacitor the capacitance of which corresponds to the optical or electronic parameter of the optoelectronic module or is dependent thereon. Preferably in that case a control unit used for driving the optoelectronic module can determine a capacitance of the capacitor, for example by checking the resonance behaviour of the encoding element.

Furthermore, the encoding element can comprise a memory unit in which there are stored digital values which correspond to the optical or electronic parameter of the optoelectronic module or are dependent thereon. Preferably a control unit used for driving the optoelectronic module is adapted to read out the digital values stored in the memory unit.

In a further preferred embodiment of the invention, the encoding element is a surface-mountable device which can also be referred to as an SMD device (SMD="surface-mountable device"). In this connection reference is also made to surface-mounting technology (SMT, "surface-mounting technology").

Preferably, however, the encoding element in the form of a surface-mountable device is not soldered to the optoelectronic module, as is usually provided in the context of surface-mounting technology. Rather, the use of surface-mountable devices is advantageous because, by virtue of their small dimensions, they require little space and component placement can be effected in series and therefore economically. Furthermore, SMD resistors and SMD capacitors are available in a large number of standard sizes and resistance values and capacitances. Finally, the use of surface-mountable devices allows the insertion thereof into the holding device provided for that purpose in a pick-and-place machine. For example, it is possible to use resistors having nominal values that correspond to an e-series.

In accordance with a further preferred embodiment of the invention, the encoding element has at least two electrical contact surfaces which are in electrical contact with the electrical contact elements of the holding device.

There is further defined an illumination device which comprises a control unit for driving the optoelectronic module, and transmission means. Via the transmission means the information provided by the encoding element can be acquired by the control unit. Typically the transmission means comprise the above-described electrical conductor tracks of the optoelectronic module.

There is further defined a process for the production of an optoelectronic module as described in connection with at least one of the above embodiments.

In accordance with at least one embodiment of the production process, first of all an optoelectronic module having at least one semiconductor device provided for emitting electromagnetic radiation is provided. Subsequently an optical or electronic parameter of the optoelectronic module is measured. For example, a brightness of the optoelectronic module can be measured by operating the semiconductor device at a reference current and at a reference temperature.

In a further process step, an encoding element is provided which carries information relating to the measured optical or electronic parameter of the optoelectronic module.

In a final process step, the encoding element is fixed in place in or on the optoelectronic module.

In particular, the encoding element can be fixed in a holding device provided for that purpose. This makes it possible to mount the encoding element in or on the optoelectronic module without an additional soldering operation being required for that purpose.

In a preferred embodiment, in the first process step an optoelectronic module is provided which comprises at least one holding device having a locking device which is movable between a locking position and a receiving position. In the receiving position, a device can be displaced along an insertion direction towards a fixing position inside the holding device. In the locking position, however, the locking device is adapted to effect at least partial fixing of the device in the fixing position. In the final process step, the encoding element can then be inserted or pushed into the fixing position along the insertion direction.

In a further embodiment of the invention, at least one of the above-described process steps is carried out at least partly in a pick-and-place machine. In particular, an encoding element having the appropriate properties can be lifted by means of vacuum tweezers of the pick-and-place machine, moved towards the optoelectronic module and fixed in place in or on the optoelectronic module.

Further advantages, advantageous embodiments and developments will be found in the exemplary embodiments described below in conjunction with Figures, wherein FIG. 5 shows schematically the insertion of an encoding element into the holding device, FIGS. 6A and B show schematic sectional views of the holding device with the encoding element inserted, FIGS. 7A, B and C show a locking device of the holding device in three different movement positions and a process for the production of an optoelectronic module in accordance with a first exemplary embodiment, FIGS. 8A, B, C and D show a process for the production of an optoelectronic module in accordance with a second exemplary embodiment, and FIGS. 9A, B and C show a process for the production of an optoelectronic module in accordance with a third exemplary embodiment.

In the exemplary embodiments and Figures, elements that are identical or similar or have identical action may in each case be denoted by the same reference numerals. The elements illustrated and the relative sizes of the elements to one another should not be regarded as to scale; rather, the size of individual elements, such as, for example, layers, components, devices and regions, may have been exaggerated in the drawings for the purpose of better clarity and/or better understanding; this may relate to individual dimensions or to all dimensions of the elements.

Figure 1:
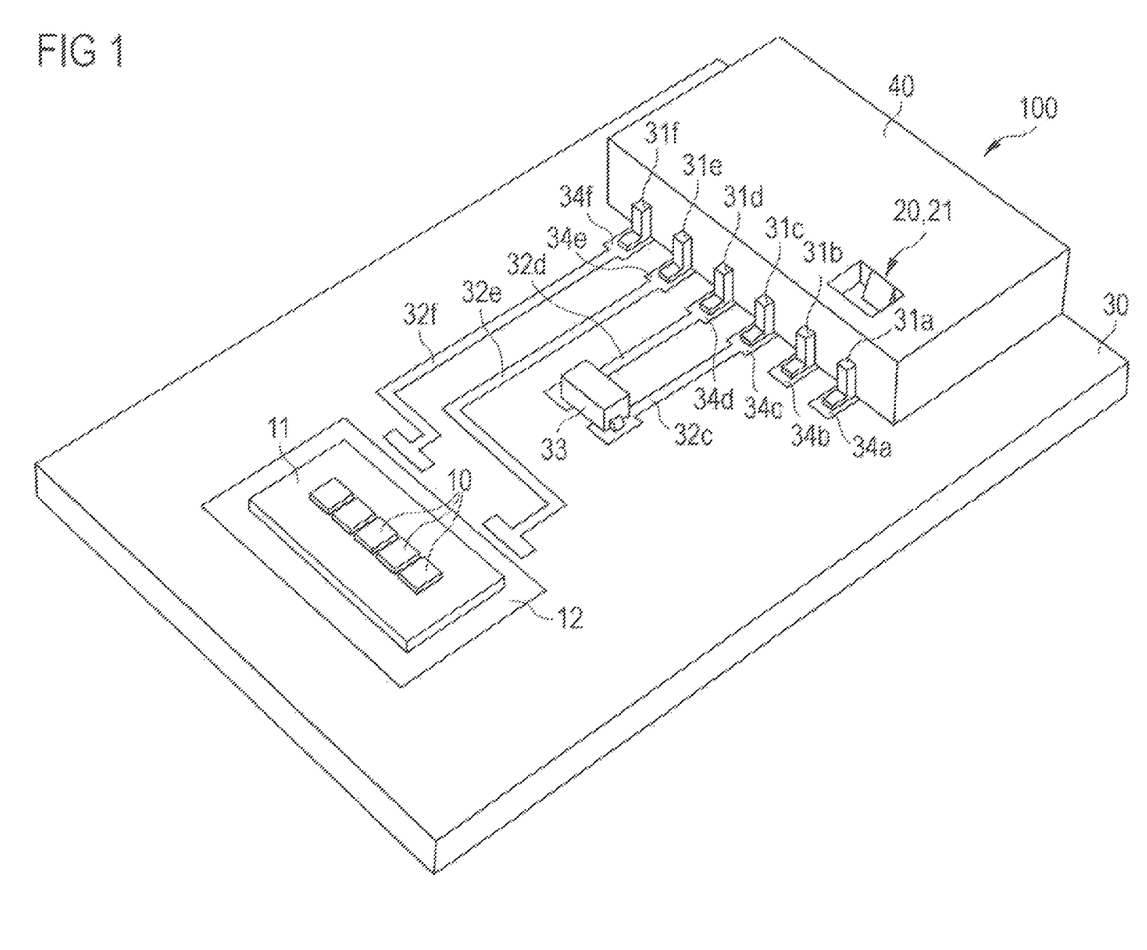
FIG. 1 is a schematic view of an optoelectronic module according to the invention in accordance with an exemplary embodiment, FIGS. 2A and B show a schematic rear view and front view, respectively, of a plug-in connector which is arranged on the optoelectronic module according to the invention in accordance with the exemplary embodiment.

FIG. 1 shows schematically an optoelectronic module according to the invention, indicated as a whole by reference numeral 100. The module comprises a plurality of semiconductor devices 10 which in operation emit blue light that is converted into white light by conversion elements (not shown in detail). The semiconductor devices 10 are soldered to a ceramic circuit board 11 which is adhesively bonded and attached to a metal core circuit board 30 serving as carrier element. On the metal core circuit board 30 there is further arranged a temperature sensor 33 which is adapted to determine the temperature of the optoelectronic module 100 or, in particular, of the plurality of semiconductor devices 10. It is also possible for each semiconductor device 10 to be assigned one temperature sensor, so that each temperature sensor essentially determines the temperature of the semiconductor device associated therewith.

The temperature sensor 33 can be in the form of a thermoelement. Furthermore, the temperature sensor 33 can also be a temperature-dependent resistor which can have a negative temperature coefficient (NTC resistor) or a positive temperature coefficient (PTC resistor). Alternatively, it is also possible for a semiconductor device, for example a transistor or a diode, to be used as temperature sensor.

There is further soldered to the metal core circuit board 30 a plug-in connector 40 in which electrical conductor tracks 41a, b, c, d, e, f (visible in FIG. 2A) are embedded. The electrical conductor tracks 41a, b, c, d, e, f terminate in a plurality of angular soldering pins 31a, b, c, d, e, f, which are soldered to corresponding soldering surfaces 34a, b, c, d, e, f of the metal core circuit board 30. The soldering surfaces 34c, d, e, f are each part of respective electrical conductor tracks 32c, d, e, f, which are arranged on the metal core circuit board 30 and via which the semiconductor devices 10 and the temperature sensor 33 are each supplied with operating current.

By means of a complementary connector (not shown), the optoelectronic module 100 is connected via the plug-in connector 40 and via a wiring harness to a control unit (not shown) which provides an operating current for the semiconductor devices 10 and the temperature sensor 33 and evaluates the measured data supplied by the temperature sensor 33.

Figure 2A:
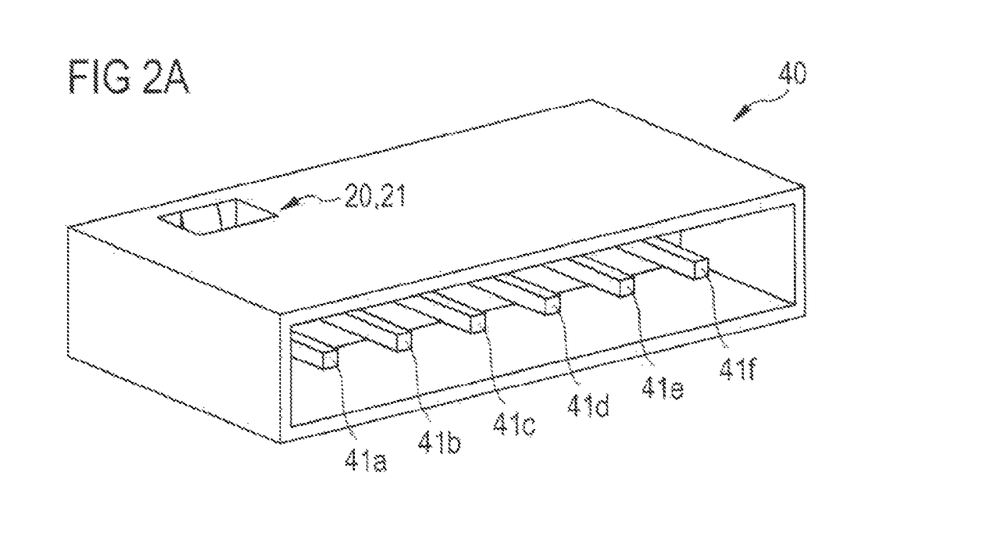
Figure 2B:
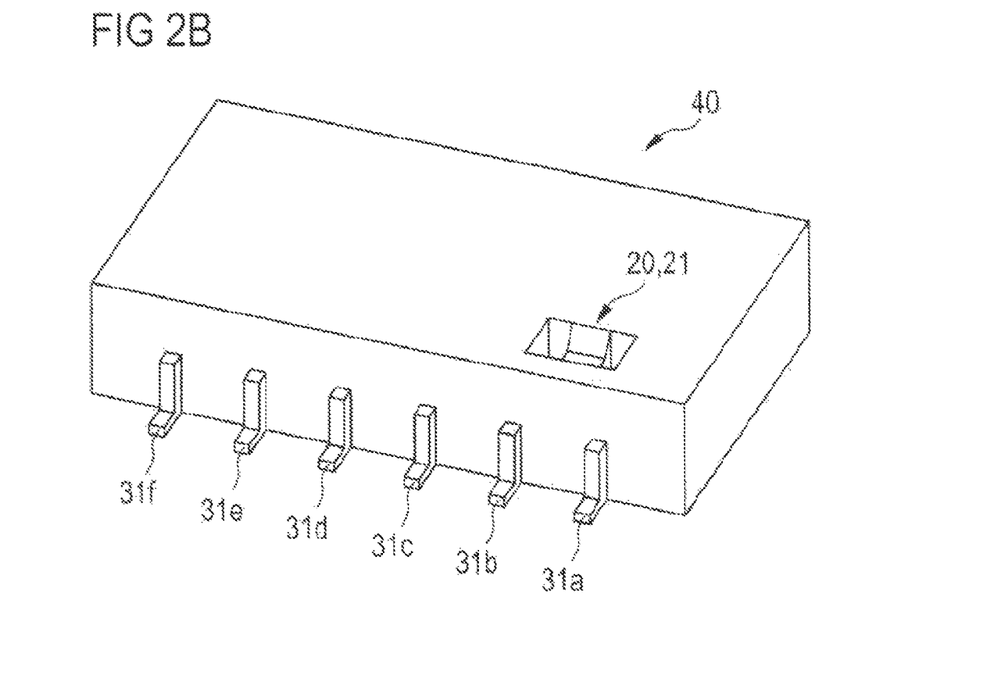

In the plug-in connector 40 there is provided a recess 21 inside which a holding device 20 for fixing in place a surface-mountable device is arranged. FIGS. 2A and B show schematic views of the plug-in connector 40 from two different perspectives. The electrical conductor tracks 41a, b, c, d, e, f embedded in the plug-in connector 40 are exposed on one side of the plug-in connectors 40 where they merge into plug-in contacts which are insertable into suitable sockets of the complementary connector (not shown). On the opposite side of the plug-in connector 40 the electrical conductor tracks 41a, b, c, d, e, f are led to the outside and are connected to the angular soldering pins 31a, b, c, d, e, f which are soldered to the soldering surfaces 34a, b, c, d, e, f provided for that purpose on the metal core circuit boards 30. The electrical conductor tracks 41c, d are used to supply electrical power to the temperature sensor 33, and the electrical conductor tracks 41e, f are used to supply electrical power to the semiconductor devices 10. The angular soldering pins 31a, b connected to the electrical conductor tracks 41a, b terminate on soldering surfaces 34a, b, which are not connected to any additional electrical conductor track on the metal core circuit board 30.

Figure 3:
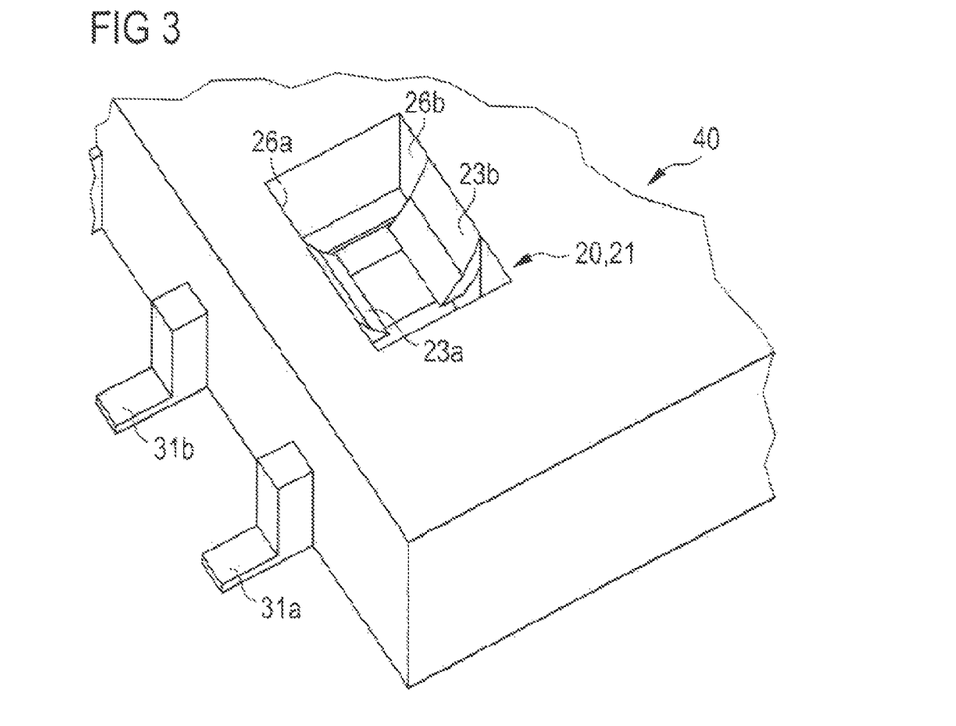
FIG. 3 shows a schematic plan view of a holding device arranged in the plug-in connector, FIGS. 4A and B are schematic sectional views of the holding device.

FIG. 3 shows a schematic, perspective view of an upper side of the plug-in connector 40. The holding device 20 provided in the recess 21 comprises two tongues 23a, b made of elastic material, for example of metal or plastics, which serve as locking elements and project from two lateral inner walls 26a, b of the recess 21.

Figure 4A:
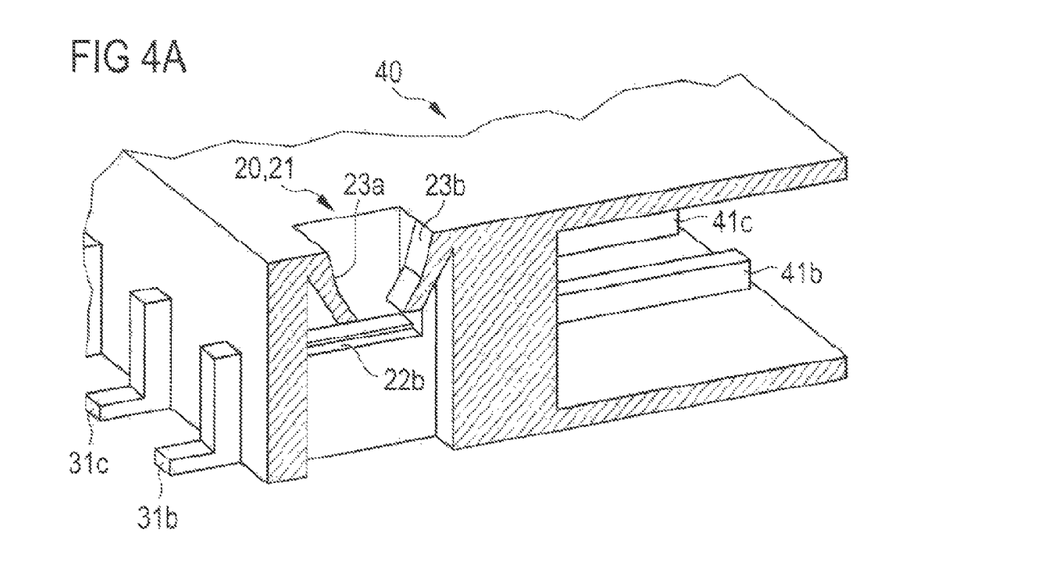
Figure 4B:
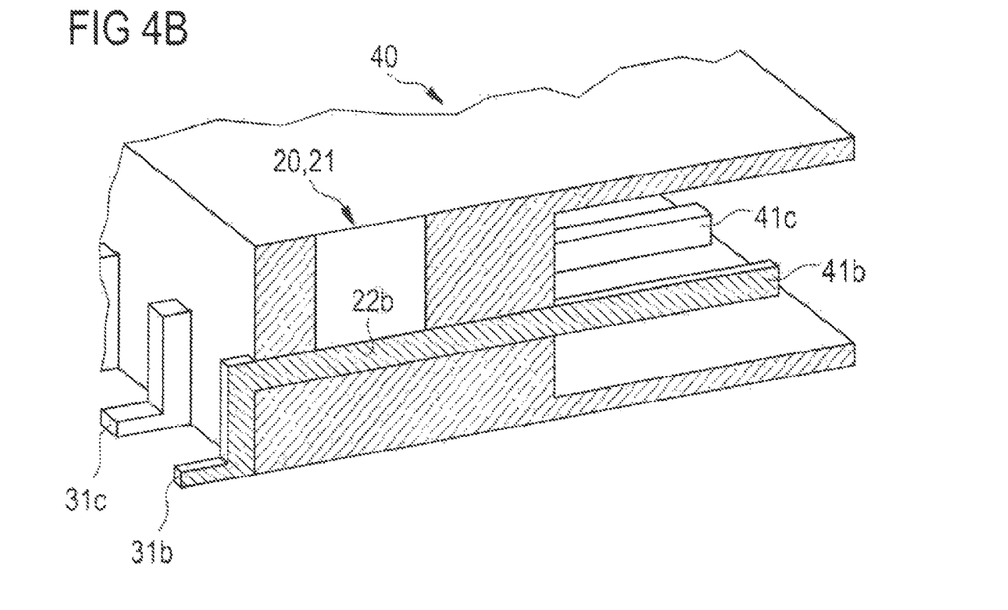

FIGS. 4A and B show two sectional views of the holding device 20, from which it can be seen that the electrical conductor tracks 41a, b guided through the plug-in connector 40 project into the recess 21 where they form electrical contact elements 22a, b (of which only the electrical contact element 22b is shown in FIGS. 4A and 4B).

Figure 5:
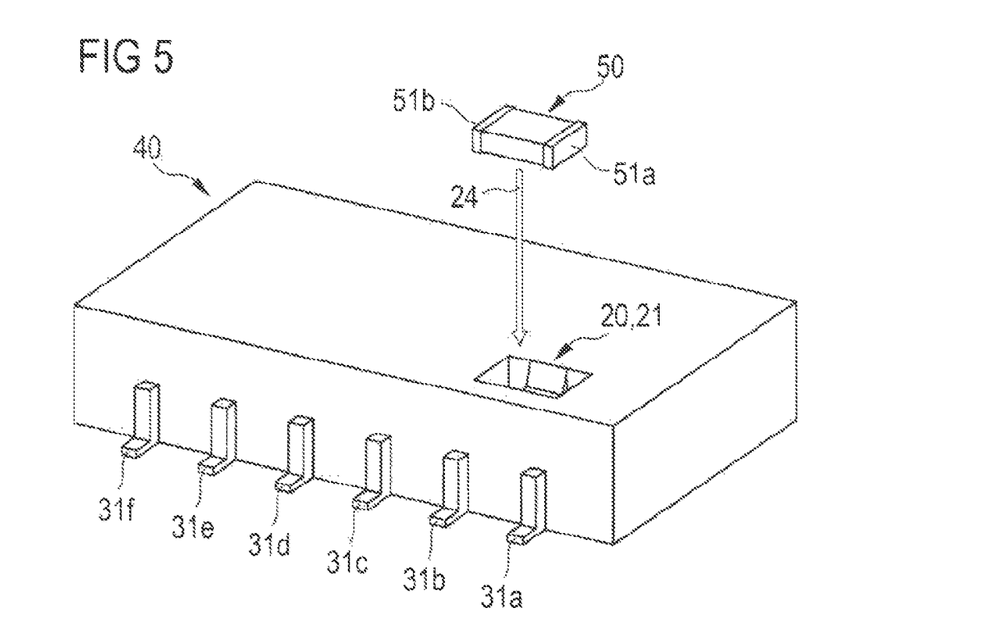

FIG. 5 is a further schematic, perspective view of the plug-in connector 40, showing an insertion direction 24 along which an encoding element 50 in the form of a surface-mountable device is insertable into the holding device 20. The insertion direction 24 runs perpendicular to the surface of the metal core circuit board 30 and parallel to the lateral inner faces 26a, b of the recess 21. The encoding element 50 is more specifically an SMD resistor, the resistance value of which corresponds to a measured brightness of the light emitted by the optoelectronic module 100. The encoding element 50 has two electrical contact surfaces 51a, b which are in electrical contact with the electrical contact elements 22a, b of the holding device 20 once the encoding element 50 has been inserted into the holding device 20.

Figure 6A:
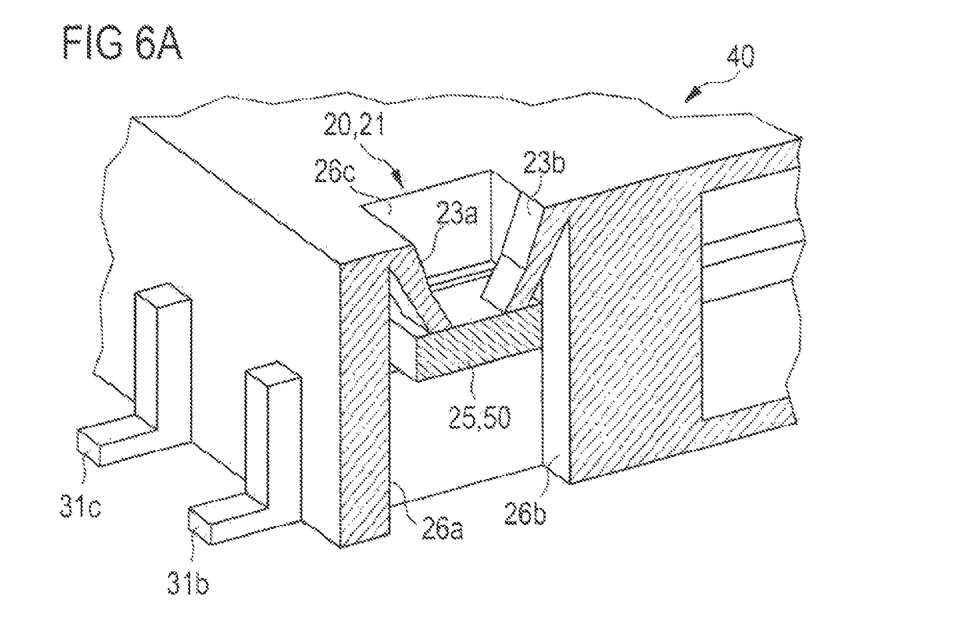

FIGS. 6A and B show two schematic, perspective views of the holding device 20 with the encoding element inserted therein. The elastic tongues 23a, b act as locking lugs which allow displacement of the encoding element 50 along the insertion direction, so that the insertion of the encoding element 50 requires the application of only a small amount of force. In a fixing position 25, in which the encoding element 50 is located in FIGS. 6A and 6B, the tongues 23a, b are located in a locking position by means of which the encoding element is irreversibly fixed in place, that is to say the encoding element 50 cannot be removed from the holding device 20 at all or can be removed therefrom only by the application of a substantial amount of force. Along the insertion direction 24, the encoding element is fixed by form lock in the fixing position 25 on the one hand by the elastic tongues 23a, b and on the other hand by the electrical contact elements 22a, b, on which the encoding element 50 is supported by means of its two electrical contact surfaces 51a, b. Perpendicular to the insertion direction 24, the encoding element 50 is fixed by form lock by inner faces 26a, b, c, d of the recess 21. As a result of the form lock fixing of the encoding element 50, the holding device 20 acts additionally as a protective device which encompasses most of the encoding element 50.

Figure 6B:
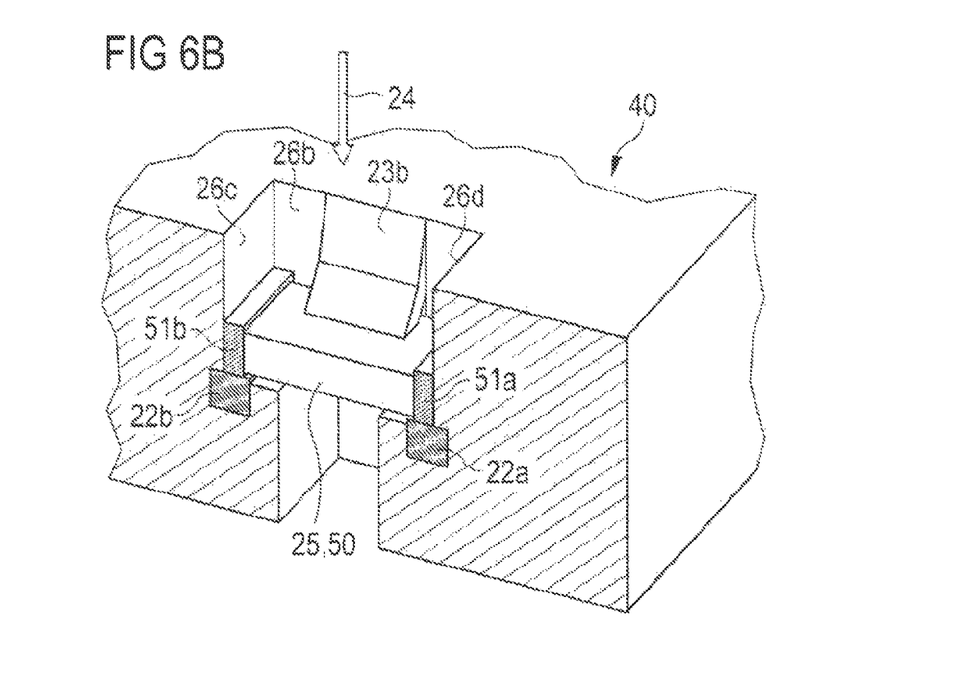

Preferably, the encoding element 50 is an SMD resistor in the form of a parallelepiped. Accordingly, the distances between the lateral inner faces 26a, b, c, d of the recess 21 and the length and the arrangement of the elastic tongues 23a, b are preferably chosen so that they are able to effect form lock fixing of a parallelepiped of such dimensions.

The encoding element 50 carries information relating to the initial brightness of the optoelectronic module 100, that is to say a brightness which has been determined by a measuring apparatus at a reference current and reference temperature prior to the actual start-up of the optoelectronic module 100. More specifically, the resistance value of the encoding element 50 is chosen so that direct or indirect measurement of the resistance value enables conclusions to be drawn as to the initial brightness of the optoelectronic module 100. Via the electrical conductor tracks 41a, b, which are connected to the two electrical contact surfaces 51a, b of the encoding element 50 via the electrical contact elements 22a, b of the holding device 20, a control unit connected thereto, which serves for driving the optoelectronic module 100, is able to determine the resistance value of the encoding element 50. The electrical conductor tracks 41a, b and the further intermediately connected elements, such as, for example, a complementary connector inserted into the plug-in connector 40 and a wiring harness running between the complementary connector and the control unit, accordingly serve as transmission means via which the information provided by the encoding element 50 can be acquired by the control unit.

On the basis of the initial brightness of the optoelectronic module 100 and optionally of a measured temperature value determined by the temperature sensor 33, the control unit provides via the electrical conductor tracks 41e, f and 32e, f a suitable operating current with which the semiconductor devices 10 are powered.

Preferably, resistance values from an e-series are used which are sufficiently distinguishable in terms of ageing and the temperature behaviour of the resistor and are each associated with specific brightness values.

Figure 7A:
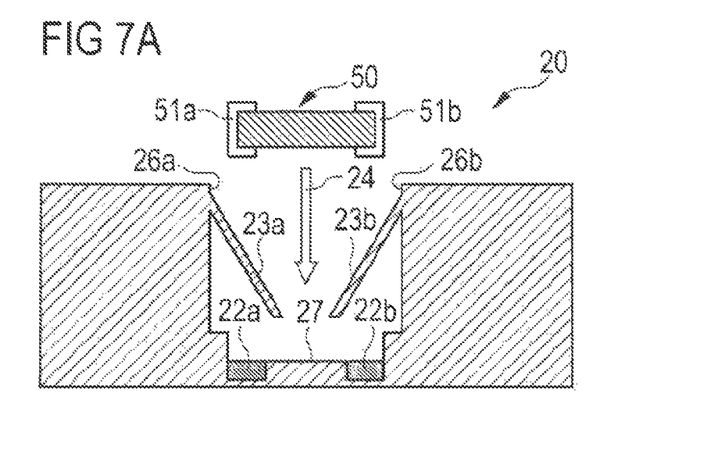
Figure 7B:
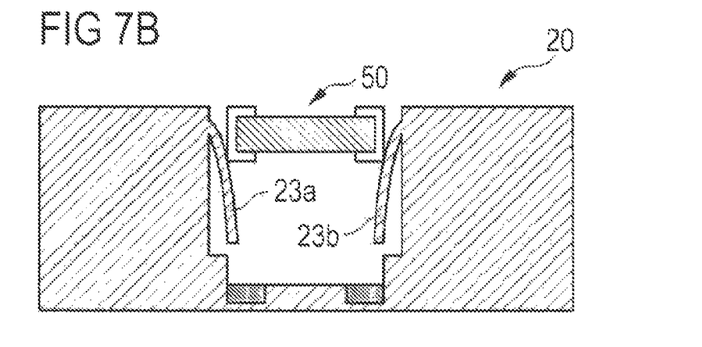
Figure 7C:
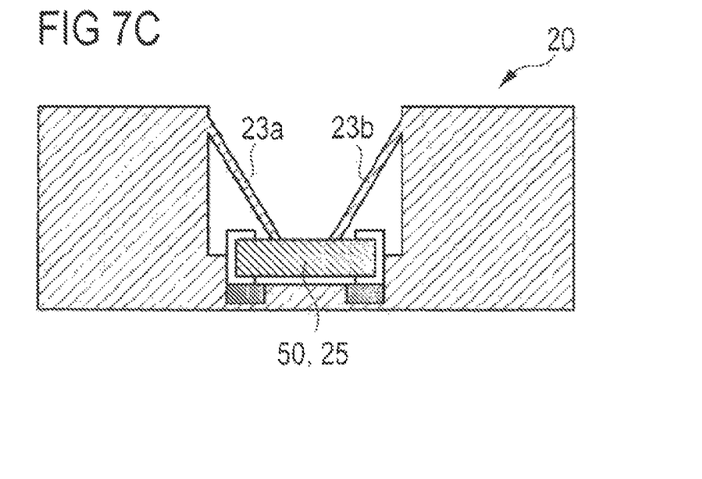

FIGS. 7A to C show the locking device formed by the elastic tongues 23a, b in three different movement positions. FIG. 7A shows the elastic tongues 23a, b in a locking position in which they form an acute angle of less than 45°, preferably less than 30°, with the insertion direction 24 and project from the two lateral inner walls 26a, b of the recess 21. The encoding element is then displaced along the insertion direction 24 until the fixing position 25 inside the holding device 20 is reached (shown in FIG. 7C).

During the displacement of the encoding element 50 along the insertion direction 24, the elastic tongues 23a, b yield and are pressed to the side, and are thereby elastically deformed, by the displacement of the encoding element 50. As a result, the elastic tongues 23a, b are moved into a receiving position (shown in FIG. 7B) in which they allow the continued displacement of the encoding element 50 along the insertion direction 24. Once the fixing position 25 has been reached (FIG. 7C), the elastic tongues 23a, b are returned to their original shape under the action of a elastic restoring force and are then located in the locking position again. In this position they fix the encoding element 50 in place in such a way that displacement in a direction opposite to the insertion direction 24 is prevented. On the base face of the recess 21 there are arranged the electrical contact elements 22a, b on which, in the fixing position 25, the encoding element 50 is supported by its two electrical contact surfaces 51a, b.

A process for the production of an optoelectronic module in accordance with a first exemplary embodiment is described hereinbelow. First of all an optoelectronic module 100 shown in FIG. 1 is provided. Then a brightness of the white light emitted by the optoelectronic module 100 is measured at a reference current and a reference temperature. A suitable encoding element 50 representing the brightness of the optoelectronic module 100 is then selected, is lifted by a vacuum tweezers of a pick-and-place machine and inserted into the holding device 20 shown in FIGS. 7A to C. More specifically, from a plurality of identically constructed SMD resistors which represent different brightness values, a device is selected the resistance value of which best represents the measured brightness of the optoelectronic module 100 and, with the aid of the vacuum tweezers of the pick-and-place machine, is pressed into the holding device 20 of the optoelectronic module 100.

Figure 8A:
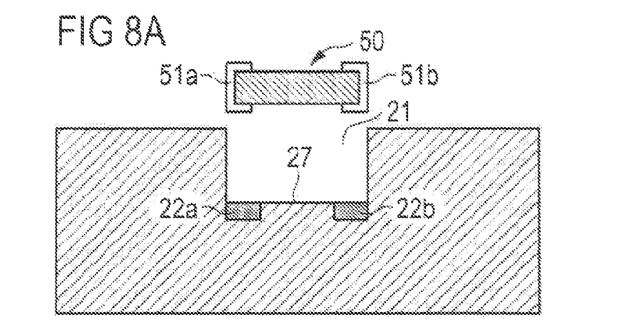
Figure 8B:
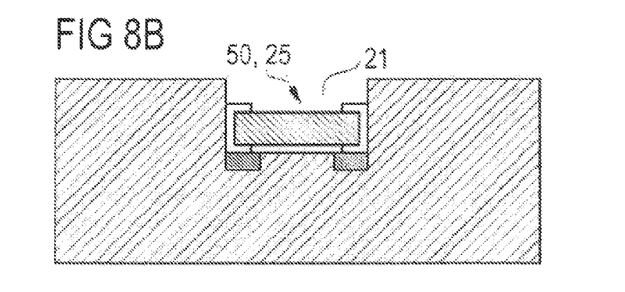
Figure 8C:
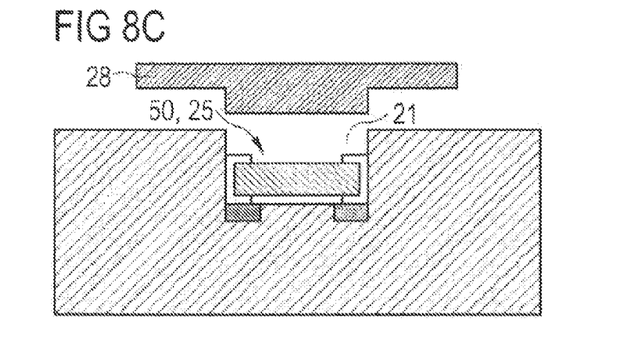
Figure 8D:
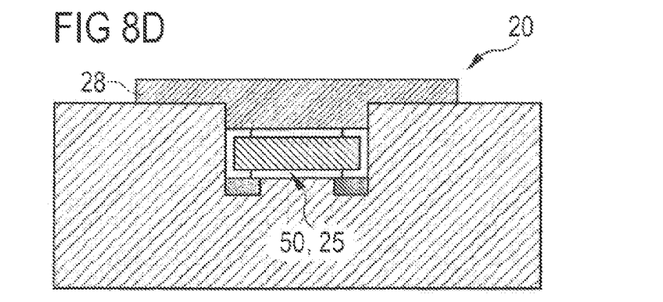

FIGS. 8A to D illustrate a process for the production of an optoelectronic module in accordance with a second exemplary embodiment. In a first process step, an optoelectronic module is provided which has a recess 21 which, for example, can again be provided in the plug-in connector 40. In contrast to FIGS. 7A to C, in this exemplary embodiment no locking elements in the form of elastic tongues or the like are provided in the recess 21. On the base face 27 of the recess 21, however, there are again arranged electrical contact elements 22a, b. Once the brightness of the optoelectronic module has been measured, a suitable encoding element 50 is inserted into the recess 21 in such a way that the two electrical contact surfaces 51a, b of the encoding element 50 lie on the electrical contact elements 22a, b arranged in the recess 21 (FIG. 8B). A cover element 28 is then arranged over the recess 21, so that the encoding element is fixed by form lock on the one hand by the lateral inner faces 26a, b of the recess and on the other hand by the cover element 28 and the base face 27 (shown in FIGS. 8C and D). As a result, a holding device 20 which fully encompasses the encoding element 50 is provided.

Figure 9A:
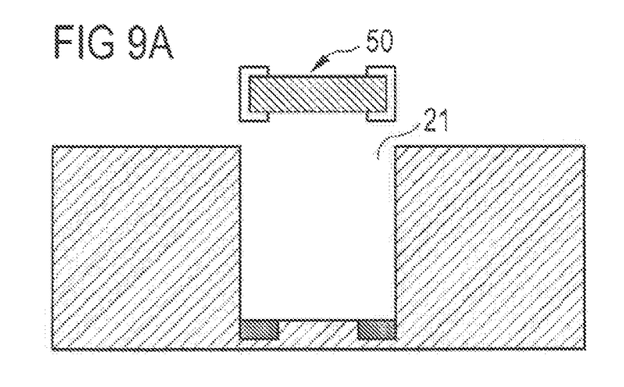
Figure 9B:
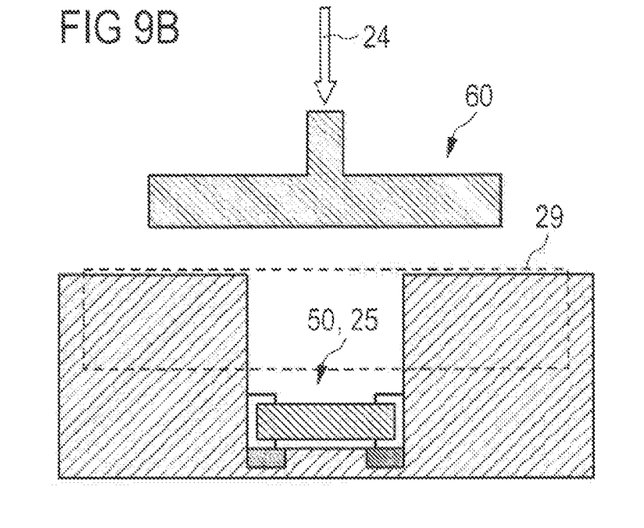
Figure 9C:
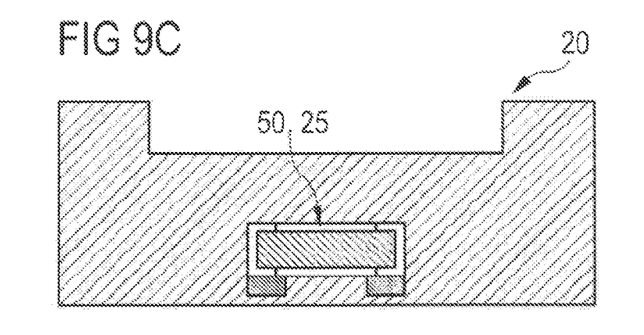

FIGS. 9A to C illustrate a process for the production of an optoelectronic module 100 in accordance with a third exemplary embodiment. This embodiment differs from the second exemplary embodiment in that no cover element is arranged on the recess 21. Rather, first of all the encoding element 50 is inserted into the fixing position 25 (shown in FIG. 9B). Then, from the outside, a heated stamp 60 is pushed along the insertion direction 24 onto a surface of the optoelectronic module in a region including the recess 21, so that material is plastically deformed in a deformation region 29. As a result, there is again produced in turn a holding device 20 which fully encompasses the encoding element 50.

The invention claimed is:

1. An optoelectronic module comprising:
    at least one semiconductor chip provided for emitting electromagnetic radiation; and
    at least one holding device; and
    at least one encoding element in the form of a surface-mountable device which carries information relating to one optical parameter or relating to one electronic parameter of the optoelectronic module and is fixed in place by the holding device,
    wherein the holding device comprises a recess, and
    wherein the encoding element is arranged in the recess, is encompassed at least partly by the holding device and is fixed to the holding device in a form-locking manner, so that the holding device acts additionally as a protective device for the encoding element.

2. The optoelectronic module according to claim 1, wherein the optoelectronic module further comprises a carrier element and the recess of the holding device is formed in the carrier element.

3. The optoelectronic module according to claim 1, wherein the recess is formed in a plug-in element or in a plug-in connector which is attached to a carrier element of the optoelectronic module.

4. The optoelectronic module according to claim 1, wherein the optoelectronic module further comprises at least two electrical conductor tracks which can be brought into conductive connection with terminals of a control unit and which are in conductive connection with at least two electrical contact elements arranged in the holding device.

5. The optoelectronic module according to claim 1, wherein the holding device comprises at least one locking device which is movable between a locking position and a receiving position, wherein in the receiving position the encoding element can be displaced along an insertion direction towards a fixing position inside the holding device and wherein in the locking position the locking device is adapted to effect at least partial fixing of the encoding element in the fixing position.

6. The optoelectronic module according to claim 5, wherein the locking device comprises at least one locking element made of elastic material which is adapted to allow displacement of the encoding element along the insertion direction towards the fixing position as a result of its being elastically deformed in consequence of the displacement, and further, once the fixing position of the encoding element has been reached, to assume its original shape and hereby fix the encoding element in place.

7. The optoelectronic module according to claim 6, wherein the locking element is in the form of a tongue which, in the locking position, forms an acute angle of less than 30° with the insertion direction and projects from a lateral inner wall of the holding device.

8. The optoelectronic module according to claim 1, wherein the encoding element comprises a resistor the resistance value of which corresponds to the optical parameter or relating to one electronic parameter of the optoelectronic module, and/or a capacitor the capacitance of which corresponds to the optical parameter or relating to one electronic parameter of the optoelectronic module, and/or a memory unit in which there are stored digital values which correspond to the optical parameter or relating to one electronic parameter of the optoelectronic module.

9. The optoelectronic module according to claim 1, wherein the encoding element has at least two electrical contact surfaces which are in electrical contact with electrical contact elements of the holding device.

10. An illumination device, comprising the optoelectronic module according to claim 1, a control unit for driving the optoelectronic module, and transmission means via which information provided by the encoding element can be acquired by the control unit, wherein the transmission means are electrical conductor tracks.

11. An optoelectronic module comprising:
    at least one semiconductor chip provided for emitting electromagnetic radiation;
    at least one holding device; and
    at least one encoding element in the form of a surface-mountable device which carries information relating to an optical parameter or relating to one electronic parameter of the optoelectronic module and is fixed in place by the holding device,
    wherein the holding device comprises a recess,
    wherein the encoding element is arranged in the recess,
    wherein the optoelectronic module comprises electrical conductor tracks which are in conductive connection with at least two electrical contact elements arranged in the recess of the holding device,
    wherein the electrical conductor tracks are conductively connectable to terminals of a control unit, so that information provided by the encoding element is acquirable by the control unit via the electrical conductor tracks, and
    wherein the encoding element comprises at least two electrical contact surfaces which are in electrical contact with the electrical contact elements of the holding device.

12. The optoelectronic module according to claim 11, wherein the encoding element comprises a resistor the resistance value of which corresponds to the optical parameter or relating to one electronic parameter of the optoelectronic module, and/or a capacitor the capacitance of which corresponds to the optical parameter or relating to one electronic parameter of the optoelectronic module, and/or a memory unit in which there are stored digital values which correspond to the optical parameter or relating to one electronic parameter of the optoelectronic module.

13. The optoelectronic module according to claim 11, wherein the encoding element is fixed in place by form lock.

14. The optoelectronic module according to claim 11, wherein the encoding element is arranged in the recess in such a way that the encoding element is encompassed at least partly by the holding device and is fixed to the holding device in a form locking manner, so that the holding device acts additionally as a protective device for the encoding element.

15. The optoelectronic module according to claim 11, wherein a cover element of the holding device is arranged over the recess, so that the encoding element is fixed by a form-locking manner on the one hand by lateral inner faces of the recess and on the other hand by the cover element and a base face of the recess, and in this way the holding device fully encompasses the encoding element.

16. The optoelectronic module according to claim 11, wherein the holding device is configured to effect an irreversible fixing of the encoding element.

* * * * *